United States Patent
Singer et al.

(10) Patent No.: US 12,300,759 B2
(45) Date of Patent: May 13, 2025

(54) METHOD OF MANUFACTURING A HYBRID DEVICE

(71) Applicant: Infineon Technologies AG, Neubiberg (DE)

(72) Inventors: Frank Singer, Regenstauf (DE); Oliver Hellmund, Neubiberg (DE); Brendan Holland, Regensburg (DE); Matthias Sperl, Mintraching (DE)

(73) Assignee: Infineon Technologies AG, Neubiberg (DE)

( * ) Notice: Subject to any disclaimer, the term of this patent is extended or adjusted under 35 U.S.C. 154(b) by 499 days.

(21) Appl. No.: 17/573,044

(22) Filed: Jan. 11, 2022

(65) Prior Publication Data
US 2022/0238751 A1    Jul. 28, 2022

(30) Foreign Application Priority Data
Jan. 26, 2021   (DE) .......................... 102021101657.6

(51) Int. Cl.
*H01L 33/00*   (2010.01)
*H01L 25/16*   (2023.01)

(52) U.S. Cl.
CPC ........ *H01L 33/0093* (2020.05); *H01L 25/167* (2013.01); *H01L 33/0066* (2013.01); *H01L 33/0095* (2013.01)

(58) Field of Classification Search
None
See application file for complete search history.

(56) References Cited

U.S. PATENT DOCUMENTS

| | | | |
|---|---|---|---|
| 9,059,333 B1* | 6/2015 | Farooq | H01L 24/94 |
| 9,728,692 B2 | 8/2017 | Gong et al. | |
| 2016/0104696 A1* | 4/2016 | LaVeigne | G01J 5/024 |
| | | | 438/23 |
| 2017/0213502 A1 | 7/2017 | Henry et al. | |
| 2018/0190712 A1 | 7/2018 | Xu et al. | |
| 2019/0088633 A1* | 3/2019 | Tao | H01L 33/0093 |
| 2019/0189044 A1 | 6/2019 | Peräläet al. | |
| 2019/0189603 A1* | 6/2019 | Wang | H01L 23/481 |
| 2020/0028036 A1 | 1/2020 | Bonar et al. | |
| 2020/0098736 A1* | 3/2020 | Liao | G02B 6/1225 |

FOREIGN PATENT DOCUMENTS

| | | |
|---|---|---|
| CN | 106024825 A | 10/2016 |
| WO | 2004097947 A2 | 11/2004 |

OTHER PUBLICATIONS

Liu, Zhaojun, et al., "Micro-light-emitting diodes with quantum dots in display technology", Light: Science & Applications (2020), Official journal of the CIOMP 2047-7538, pp. 1-23.

* cited by examiner

*Primary Examiner* — Bradley Smith
(74) *Attorney, Agent, or Firm* — Murphy, Bilak & Homiller, PLLC

(57) ABSTRACT

A method of manufacturing a micro-light-emitting diode display includes processing a wafer to form a plurality of functional chips integral with the wafer. A plurality of wafer tiles is defined in the wafer, wherein each wafer tile is composed of a cluster of functional chips. The wafer tiles are singulated by wafer dicing. A plurality of separate wafer tiles is bonded to a semiconductor wafer by hybrid bonding. The functional chips are singulated together with chips of the semiconductor wafer by dicing the bonded-together wafer tiles and semiconductor wafer.

14 Claims, 8 Drawing Sheets

METHOD OF MANUFACTURING A HYBRID DEVICE

TECHNICAL FIELD

This disclosure relates to the field of hybrid devices comprising bonded-together chips, and in particular to methods of manufacturing hybrid devices based on III-V semiconductor functional chips.

BACKGROUND

Conventionally, hybrid devices are produced by bonding a wafer to a semiconductor wafer and by dicing the bonded-together wafer and semiconductor wafer in composite chips, i.e. in chips which are composed of a functional chip diced out of the wafer and a semiconductor chip diced out of the semiconductor wafer.

For instance, micro-LED displays can be manufactured that way by bonding a micro-LED wafer to a semiconductor wafer containing integrated circuits for controlling the micro-LEDs. This concept of manufacture is challenging in terms of ensuring high yields because of the occurrence of defective micro-LEDs on the micro-LED wafer and problems in achieving high quality bonds between the micro-LED wafer and the semiconductor wafer. Further, the micro-LED wafer is usually of a different material (e.g. GaN) than the semiconductor wafer (e.g. Si) and thus has significantly different thermomechanical properties.

SUMMARY

According to an aspect of the disclosure a method of manufacturing a hybrid device includes processing a wafer to form a plurality of functional chips integral with the wafer. A plurality of wafer tiles is defined in the wafer, wherein each wafer tile is composed of a cluster of functional chips. The wafer tiles are singulated by wafer dicing. A plurality of separate wafer tiles is bonded to a semiconductor wafer by hybrid bonding. The functional chips are singulated together with chips of the semiconductor wafer by dicing the bonded-together wafer tiles and semiconductor wafer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

FIG. 3 is a schematic cross-sectional view illustrating a stage of wafer tile singulation.

FIGS. 4A and 4B are schematic top side views illustrating examples of bonding a plurality of wafer tiles to a semiconductor wafer.

FIG. 5C is a schematic cross-sectional partial view illustrating the formation of a common front side electrode layer on each micro-LED array.

FIG. 6A is a schematic cross-sectional view illustrating an exemplary stage of manufacturing a micro-LED display by chip singulation.

FIG. 6B is a schematic cross-sectional view illustrating a further exemplary stage of manufacturing a micro-LED display by chip singulation.

DETAILED DESCRIPTION

As used in this specification, layers or elements illustrated as adjacent layers or elements do not necessarily be directly contacted together; intervening elements or layers may be provided between such layers or elements. However, in accordance with the disclosure, elements or layers illustrated as adjacent layers or elements may in particular be directly contacted together, i.e. no intervening elements or layers are provided between these layers or elements, respectively.

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
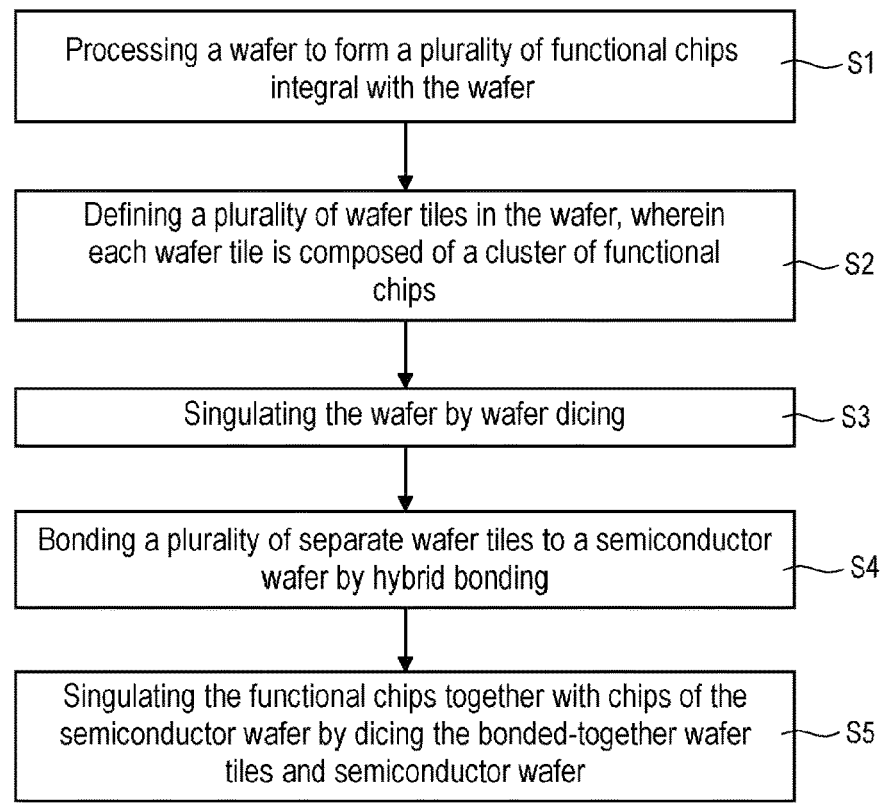
FIG. 1 is flowchart illustrating stages of a method of manufacturing an exemplary hybrid device.

Referring to FIG. 1, at S1 a wafer is processed to form a plurality of functional chips integral with the wafer. As an example which will be described in greater detail further below, the wafer may, e.g., be a micro-LED wafer and the functional chips integral with the wafer may, e.g., be formed by micro-LED arrays, wherein each micro-LED array corresponds to a micro-LED chip.

At S2 a plurality of wafer tiles in the wafer is defined. Each wafer tile is composed of a cluster of functional chips. Each functional chip contains monolithically integrated functional devices (e.g. micro-LEDs of the micro-LED array).

At S3 the wafer tiles are singulated by wafer dicing. Each wafer tile may, e.g., have the same size and may contain the same number of functional chips (e.g. micro-LED arrays).

At S4 a plurality of separate wafer tiles is bonded to a semiconductor wafer by hybrid bonding. The semiconductor wafer may include integrated circuits for controlling the functional devices (e.g. the micro-LEDs). In particular, each functional device may be individually controllable by an integrated circuit. For instance, if the functional device is a micro-LED, each micro-LED may be individually controllable by an integrated circuit.

At S5 functional chips are then singulated together with chips of the semiconductor wafer by dicing the bonded-together wafer tiles and the semiconductor wafer. This common dicing step may produce the hybrid devices.

Figure 2A:
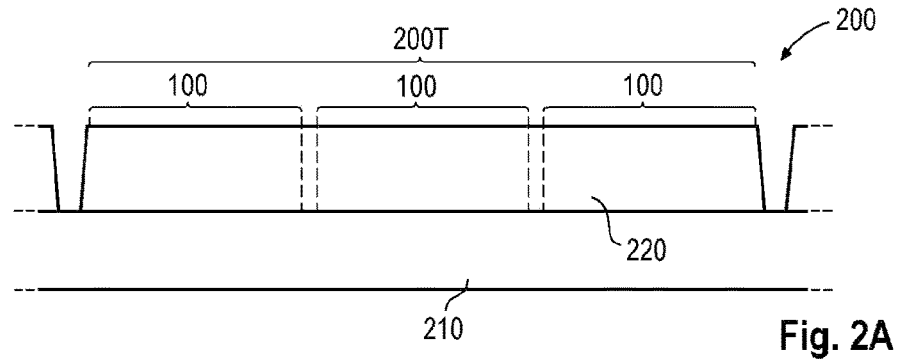
FIG. 2A is a schematic cross-sectional view of a wafer tile of an exemplary wafer, the wafer tile including a cluster of functional chips.

FIG. 2A illustrates a partial view of an exemplary wafer 200 and shows a so-called wafer tile 200T of the wafer 200. The wafer 200 includes a plurality wafer tiles 200T. Each wafer tile 200T includes a plurality of functional chips 100 integral with the wafer 200. The plurality of functional chips 100 included in a wafer tile 200T will be denoted as a cluster of functional chips 100. In FIG. 2A, only three functional chips 100 are depicted for ease of illustration. In practice, the cluster of functional chips 100 included in a wafer tile 200T is typically much larger than being composed of three functional chips 100.

The functional chips 100 are monolithically integrated in the wafer 200 and hence in a respective wafer tile 200T. As will be described further below in greater detail, each functional chip 100 integral with the wafer 200 corresponds to a single functional chip diced out of a wafer tile 200T at a later stage of the manufacturing process.

The wafer 200 may comprise a substrate 210 and a functional layer 220 disposed over the substrate 210. The functional layer 220 may e.g. be composed of one or a plurality of epitaxial semiconductor layers, in which functional devices (not shown) are formed. For instance, as will be set out in detail further below, a pattern of functional devices may be formed in the functional layer 220. The functional layer 220 may comprise or be made of semiconductor material, e.g. wide bandgap (WBG) semiconductor material or III-V semiconductor material. The substrate 210 may be of sapphire, Si, GaN, GaAs or glass or any other material suitable, e.g., as a base material for epitaxial growth.

The functional devices contained in the functional chips 100 are fundamental for the function of the hybrid device to be manufactured. For instance, as will be described in more detail further below, a functional device may e.g. be a micro-LED. The hybrid device may then be a micro-light emitting diode display.

Figure 2B:
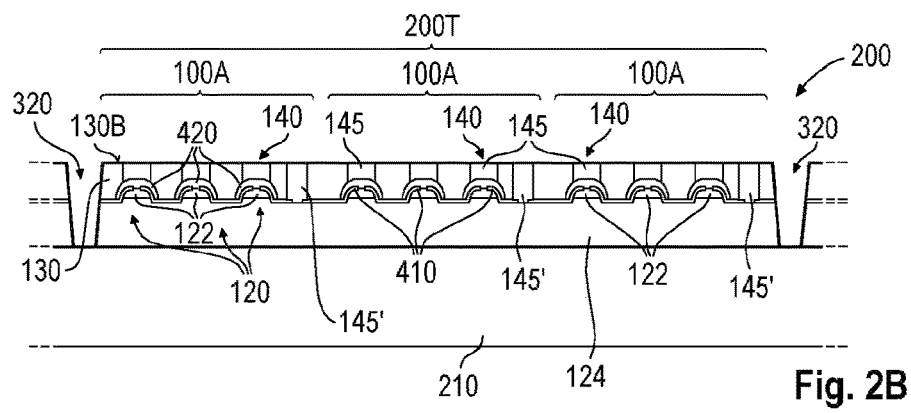
FIG. 2B is a schematic cross-sectional view of a wafer tile in which each functional chip is implemented by a micro-LED array.

FIG. 2B illustrates a specific example in which the wafer 200 is configured as a micro-LED wafer. In this example, the functional layer 220 may include an e.g. continuous second semiconductor layer 124 of a second dopant type (e.g. an epitaxial n-GaN layer) formed over the substrate 210 and a structured first semiconductor layer 122 (e.g. an epitaxial p-GaN layer) formed adjacent to the second semiconductor layer 124. In this example, each functional chip 100 integral with the micro-LED wafer 200 is implemented by a micro-LED array 100A. Each micro-LED array 100A includes a plurality of micro-LEDs 120 arranged in a regular array.

In FIG. 2B, each micro-LED array 100A is shown in simplified form to include only three micro-LEDs 120. In practice, each micro-LED array 100A typically includes a much larger number of individual micro-LEDs 120.

A variety of different designs of micro-LEDs 120 may be involved. In the following, a specific design of a micro-LED 120 is used for purpose of explanation, and exemplary methods of manufacturing a micro-LED wafer 200 having micro-LEDs 120 of this specific design will be described later in conjunction with FIGS. 7A-7J. However, the scope of this disclosure is neither limited to functional devices implemented by micro-LEDs 120 nor to micro-LEDs 120 of any such specific design.

In FIG. 2B, the structure of the first semiconductor layer 122 corresponds to the pattern of the micro-LEDs 120. The micro-LEDs 120 and hence the arrays of micro-LEDs 100 are embedded in an embedding layer 130 of the micro-LED wafer 200. The embedding layer 130 is an electrically insulating layer which may, e.g., comprise or be of silicon oxide or silicon nitride.

Each micro-LED 120 includes a structure of the first semiconductor layer 122 and the second semiconductor layer 124 arranged adjacent the first semiconductor layer 122. Through-connections 140 may extend from a back surface 130B of the embedding layer 130 to the first semiconductor layer 122 of each micro-LED 120. As exemplified in FIG. 2, the through-connections 140 may each comprise a contact pillar 145. Further, contact pillar 145' extending from a back surface 130B of the embedding layer 130 to the second semiconductor layer 124 may be provided.

Optionally, a dielectric layer 410 and/or a reflector metal layer 420 may form part of each micro-LED 120. An exemplary method of producing such micro-LED wafer 200 will be described in greater detail in conjunction with FIGS. 7A-7I.

Figures 3, 4A:
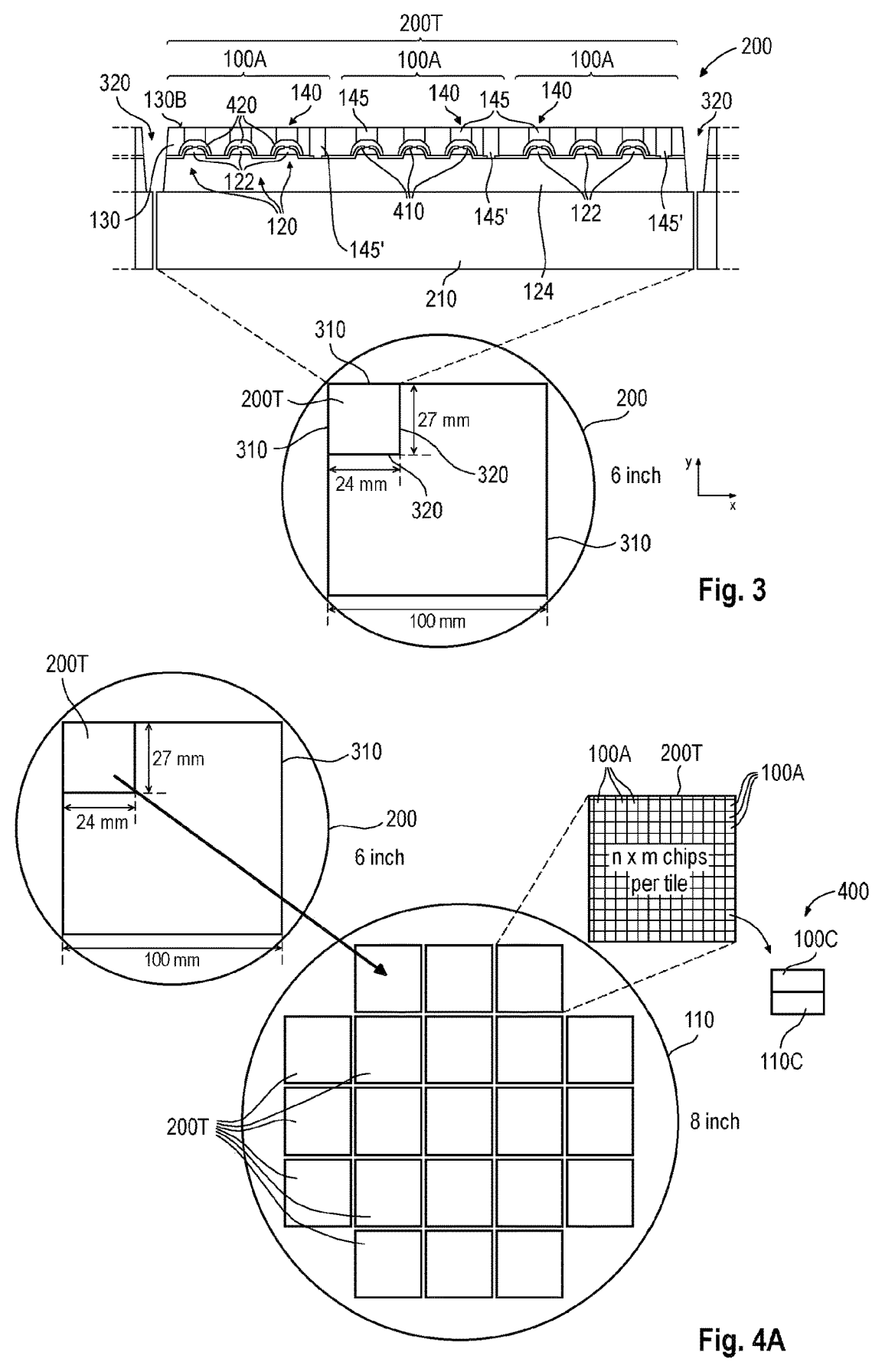

FIG. 3 illustrates a process of wafer tile singulation. For instance, this process may be carried out in a plurality of stages. A first stage of this process is already illustrated in FIGS. 2A-2B and may comprise kerf formation between wafer tiles 200T along wafer tile dicing streets 320. In the example of micro-LED wafer tiles 200T, the embedding layer 130 and, e.g., the second semiconductor layer 124 may be removed along the wafer tile dicing streets 320 by, e.g., etching. The substrate 210 may remain unaffected (i.e. integral) during this first stage.

A second stage of the wafer tile singulation process may comprise substrate dicing. Substrate dicing is accomplished along and in alignment with the dicing streets 320. For instance, in particular if the substrate 210 is a sapphire substrate, stealth laser dicing may be used. Other dicing techniques which may, e.g., be employed for substrate dicing are plasma etching or sawing.

It is to be noted that singulating the wafer tiles 200T by wafer dicing may also be accomplished in a one stage process in which the functional layer 220 (e.g. embedding layer 130 and second semiconductor layer 124) and the substrate 210 are cut simultaneously by using, e.g., any of the above-mentioned dicing techniques.

FIG. 3 illustrates a processed area 310 of the wafer 200, e.g. micro-LED wafer 200. The processed area 310 of the wafer 200 is subdivided in wafer tiles 200T (e.g. micro-LED wafer tiles 200T). Each wafer tile 200T includes the defined cluster (or array) of functional chips 100 (e.g. micro-LED arrays 100A).

Before wafer tile dicing, the cluster of functional chips 100 (e.g. micro-LED arrays 100A) of which each wafer tile 200T of the wafer 200 is to be composed needs to be defined. That is, an aspect of the disclosure is to define a wafer tile size and a wafer tile shape before sub-dividing the 200 into these wafer tiles 200T.

The wafer tile size may be defined by the number of functional chips 100 (e.g. micro-LED arrays 100A) contained in the wafer tile 200T based on a given size of a functional chip 100 (e.g. micro-LED array 100A), i.e. the chip size. Other ways to define the wafer tile size are to specify the area size of the wafer tile 200T and/or its dimensions in the X- and Y-direction.

For instance, the wafer tile size may be determined based on a desired (or minimum acceptable) yield, since the probability of the occurrence of defective functional devices (e.g. micro-LEDs) on a wafer tile 200T increases with wafer tile size. Further aspects may involve wafer bow (smaller wafer tiles 200T will exhibit a smaller bow than larger wafer tiles 200T and may therefore be more easily handled during the subsequent manufacturing processes). Further, the wafer tile size may be chosen to depend on the degree of the difference of thermomechanical properties of the wafer 200 and the semiconductor wafer 110 to which the wafer tiles 200T are to be bonded. The greater the difference in CTE (coefficient of thermal expansion) of the wafer 200 and the semiconductor wafer 110 (see FIGS. 4A-4B), the smaller may be the optimum wafer tile size in terms of yield and/or cost optimization.

Other aspects which may be considered for defining a wafer tile size are the (given) size of the wafer 200 (e.g. currently typically 6 inches) in an effort to arrive at a high degree of wafer area utilization and/or the (given) size of the semiconductor wafer 110 (see FIGS. 4A-4B—e.g. 12 inches) in an effort to arrive at a high degree of semiconductor wafer 110 area utilization.

Further, the wafer tile shape may be determined. The wafer tiles 200T may, e.g., have a polygonal shape. For example, a wafer tile 200T may have the shape of a rectangle, e.g., a square, or a hexagon. The determination of the shape may be based on the size of the micro-LED wafer 200 and/or on the size of the semiconductor wafer 110 and/or on considerations to arrive at a high degree of wafer area utilization (e.g. a hexagonal shape may be preferred).

In the following, a non-limiting, illustrative example for subdividing a wafer (e.g. micro LED wafer) 200 into wafer tiles 200T is described. Here, a wafer tile 200T is defined to be a rectangle including n x m functional chips 100 (e.g. micro-LED array 100A which are future micro-LED chips), where n is the number of rows and m is the number of columns of functional chips 100 (e.g. micro-LED arrays 100A).

For instance, a functional chip 100 may include 1920× 1080 functional devices (e.g. micro-LEDs 120, i.e. pixels). Each functional device (e.g. pixel) may have a pitch of 1-5 μm, e.g. about 2 μm. The size of the hybrid device (e.g. the display size of one micro-LED array 100A) is then ~3500× 2000 μm. The size of one functional chip 100 (e.g. micro-LED array 100A), i.e. the chip size, may then e.g. be ~4.5 mm×3 mm. The chip size (e.g. size of a micro-LED array 100A) is a predetermined quantity depending on the technology used for processing the wafer 200 and on the desired number of functional devices (e.g. micro-LEDs 120) of the functional chip 100 (e.g. the micro-LED array 100A).

For instance, n=6 and m=7. Then, the Y-dimension of the wafer tile 200T is 6×4.5 mm=27 mm and the X-dimension of the wafer tile 200T is 8×3 mm=24 mm. Differently put, this exemplary wafer tile 200T includes 6×7=42 functional chips 100 (e.g. micro-LED arrays 100A corresponding to future micro-LED chips) and has a size of 27 mm×24 mm. It is to be understood that this is a specific example, and the disclosure is intended to comprise modifications of the above quantities within wide ranges of, e.g., ±100% or ±75% or ±50% of the above quantities.

In some examples a wafer tile 200T may, e.g., have a size in Y-dimension in a range between 20 mm and 60 mm and a size in X-dimension in a range between 20 mm and 60 mm.

In some examples a wafer tile 200T may, e.g., include a number of functional chips 100 (e.g. micro-LED arrays 100A) in a range between 5 and 500 or 10 and 200 or 20 and 100.

Generally, all wafer tiles 200T may have the same size and/or number of functional chips 100 (e.g. micro-LED arrays 100A) or may have different sizes and/or number of functional chips 100 (e.g. micro-LED arrays 100A) depending on, e.g., where they will be placed on a semiconductor wafer 110 for hybrid bonding (see FIGS. 4A-4B) during subsequent processing.

It is to be noted that wafer 200 processing may not need to consider the subdivision of the wafer 200 into wafer tiles 200T. In other words, the subdivision pattern determined for wafer tile singulation needs not to show up in the pattern of functional chips 100 (e.g. micro-LED wafer arrays 100A) formed on the wafer 200 during front-end-of-line (FEOL) processing.

Figure 4B:
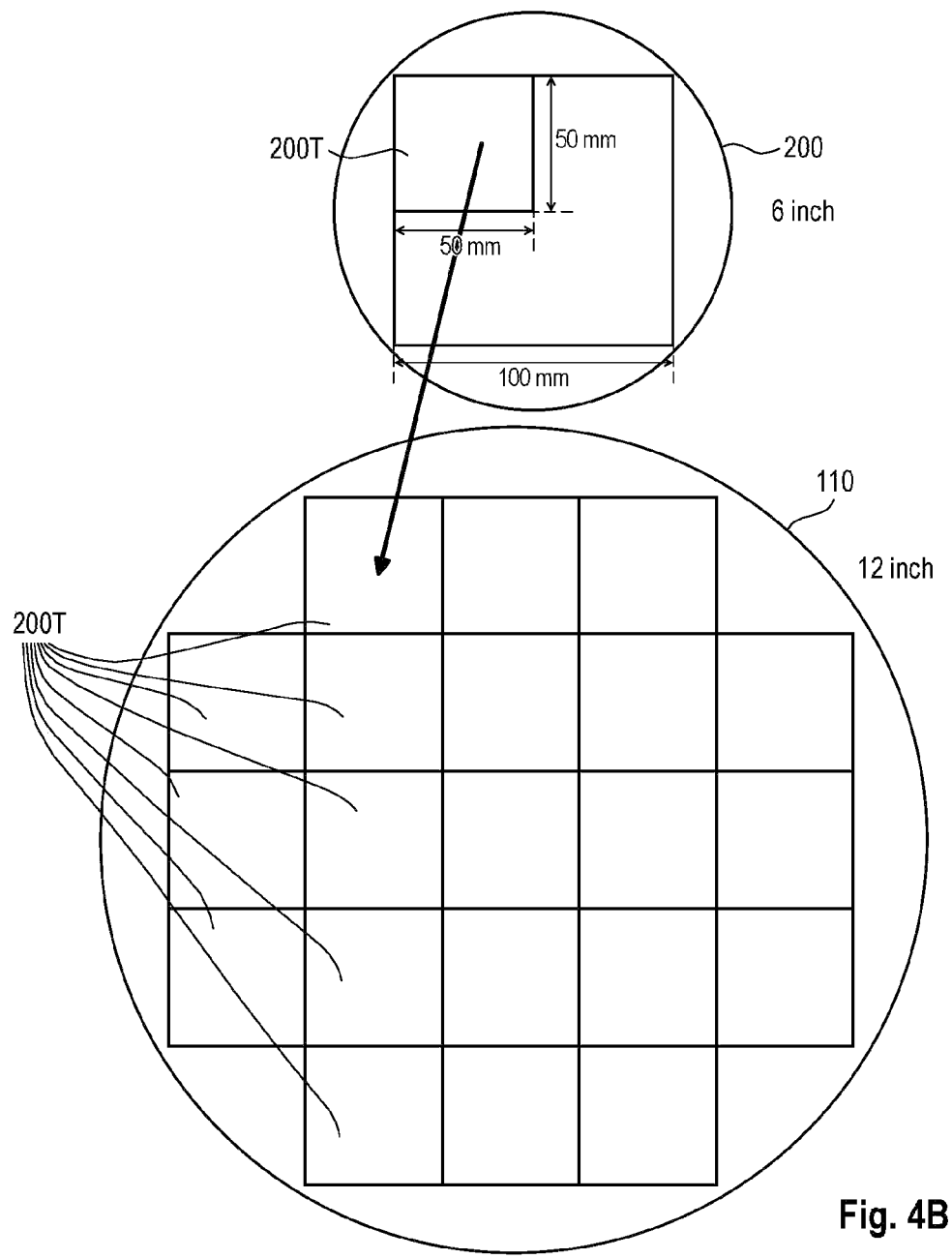

FIGS. 4A and 4B illustrate examples of bonding a plurality of wafer tiles 200T to a semiconductor wafer 110. As will be described in greater detail further below, the semiconductor wafer 110 serves as a contact backplane for the functional chips 100 (e.g. micro-LED arrays 100A). The semiconductor wafer 110 may include integrated circuits (not shown) configured to individually control each functional device (e.g. micro-LED 120). In some examples, the semiconductor wafer 110 may be a CMOS (complementary metal oxide semiconductor) wafer.

The tile-to-wafer bonding concept disclosed herein allows to use wafers 200 (containing the functional devices) and semiconductor wafers 110 (containing the control circuitry for the functional devices) of different sizes. In particular, the size of the semiconductor wafer 110 may be greater than the size of the wafer 200. The possibility of using different wafer sizes provides for an additional degree of freedom for yield optimization, since typically, the probability of defects (e.g. defective CMOS integrated circuits) in the semiconductor wafer 110 is significantly lower than the probability of defects (e.g. defective pixels or other types of functional devices) in the wafer 200. Moreover, the yield of the hybrid bonding process can be adjusted by wafer tile size selection, since hybrid bonding yield is dependent on wafer tile bow and/or on CTE mismatch between the wafer 200 and the semiconductor wafer 110—and hence on wafer tile size.

FIG. 4A illustrates a specific example in which wafer tiles 200T from a 6 inch wafer 200 are bonded to an 8 inch semiconductor wafer 110. The wafer tiles 200T have, e.g., a size of 27 mm×24 mm and may, e.g., include 6×7=42 functional chips 100 (e.g. micro-LED arrays 100A). In the example shown in FIG. 4A, e.g. 21 wafer tiles 200T are bonded to the semiconductor wafer 110.

As already mentioned, the functional chips 100 together with chips of the semiconductor wafer 110 will then be singulated by dicing the bonded-together wafer tiles 200T and semiconductor wafer 110. That way, hybrid devices 400 as illustrated in FIG. 4A in a schematic side view representation will be produced. The hybrid devices 400 are composed of a singulated functional chip 100C (i.e. the chip produced by dicing the functional chip 100 integral with the wafer out of the wafer) and a semiconductor chip 110C diced out of the semiconductor wafer 110.

FIG. 4B illustrates a specific example in which wafer tiles 200T from a 6 inch wafer 200 are bonded to a 12 inch semiconductor wafer 110. The wafer tiles 200T have, e.g., a size of 50 mm×50 mm. In the example shown in FIG. 4B, e.g. 21 wafer tiles 200T are bonded to the semiconductor wafer 110.

As will be described in more detail further below, bonding is carried out by hybrid bonding technology. Upon placement on the semiconductor wafer 110, the wafer tiles 200T may be spaced apart from each other by only a small distance corresponding to, e.g., the width of the dicing streets 320 formed during wafer tile singulation, or the wafer tiles 200T may be placed in abutment to each other. The wafer tiles 200T may be placed in a pattern to most efficiently cover the semiconductor wafer 110.

For instance, the number of wafer tiles 200T bonded to the semiconductor wafer 110 is between 10 and 50. Specific bonding tools may be used for wafer tile-to-semiconductor wafer hybrid bonding.

In the following description stages of the manufacturing process are described without loss of generality by using a micro-LED wafer as an example of the wafer 200, i.e. by using micro-LED arrays 100A for implementing the functional chips 100 integral with the wafer 200. This description, however, is not limited to micro-LED functional chips but applies to the general case in which the hybrid device to be manufactured is based on functional chips 100 which are different from micro-LED chips.

Figure 4C:
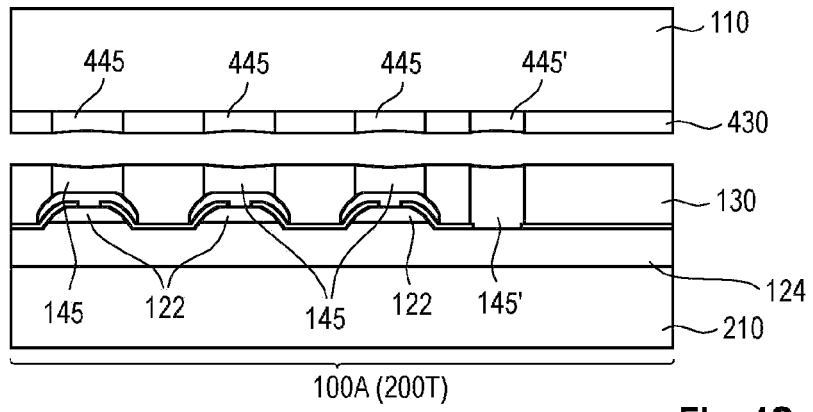
FIG. 4C is a schematic cross-sectional partial view illustrating wafer tile to semiconductor wafer bonding as shown in FIGS. 4A and 4B.

FIG. 4C illustrates the process of bonding the embedding layer 130 of a wafer tile 200T to the semiconductor wafer 110. The sectional view illustrates a portion of the wafer tile 200T which corresponds to one micro-LED array 100A. The semiconductor wafer 110 may be provided with an insulating surface layer 430 embedding an array of contacts 445 and, e.g., a contact 445'. Bonding the semiconductor wafer 110 to the embedding layer 130 may comprise electrically connecting the array of backside contacts formed by the contact pillars 145 to the array of contacts 445 of the semiconductor wafer 110. Further, the backside contact formed by the contact pillar 145' may be electrically connected to the contact 445' of the semiconductor wafer 110.

The bonding step is carried out by the conventional technique of hybrid wafer bonding, which, however, is used here for tile-to-wafer bonding. That is, hybrid bonding is carried out on tile-to-wafer level rather than on wafer-to-wafer level or chip-to-wafer level. Hybrid tile-to-wafer bonding may include $H_2$ conditioning of the hybrid contact surfaces prior to the bonding step.

Figure 5A:
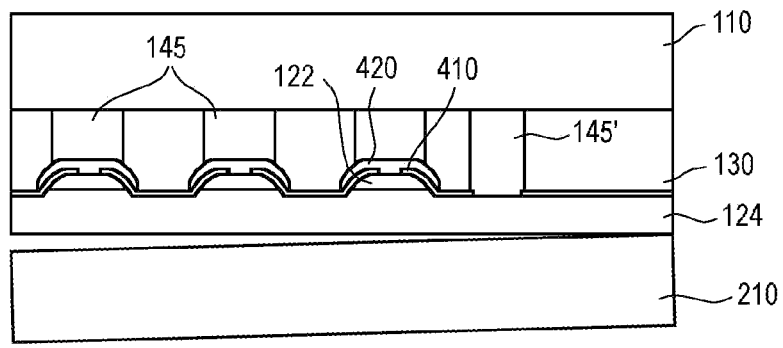
FIG. 5A is a schematic cross-sectional partial view illustrating substrate removal from the wafer tile after being bonded to the semiconductor wafer.

The substrate 210 is then removed as illustrated in FIG. 5A. For instance, in particular if a sapphire substrate 210 is used, the removal of the substrate 210 may be carried out by a laser release process. Other processes to release the substrate 210 from the embedding layer 130 such as, e.g., grinding and/or etching may also be used (e.g. if a Si or a GaAs substrate 210 is used). Substrate removal is carried out on tile/wafer level.

During subsequent wafer tile processing a common front side electrode layer may be provided to each micro-LED array 100A. Generally, such common front side electrode layer may, e.g., comprise or be of an n-GaN material and/or a metal material and/or a transparent conductive oxide (TCO) material such as, e.g., indium tin oxide (ITO).

One possibility is to simply use the second semiconductor layer 124 (which is e.g. of an n-GaN material) as the common front side electrode layer.

Figure 5B:
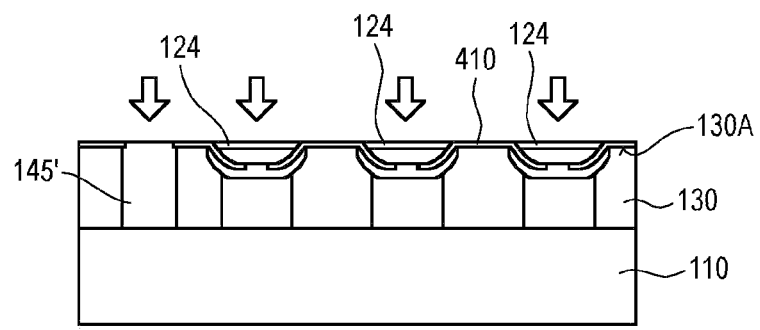
FIG. 5B is a schematic cross-sectional partial view illustrating an exemplary stage of wafer tile thinning after being bonded to the semiconductor wafer.

According to another example, the second semiconductor layer 124 may be removed by thinning and another common front side electrode layer may be applied instead. FIG. 5B illustrates a process of thinning the second semiconductor layer 124. The second semiconductor layer 124 may, e.g., be thinned to an extent that the second semiconductor layers 124 of adjacent micro-LEDs 120 become separate from each other.

For example, a two-step thinning process may be used. A first thinning step may use dry etching down to an etch stop layer (not shown) which is a short distance away from the final thinning level. A second etching step may then be used to slowly etch the residual second semiconductor layer 124 down to remove all or at least nearly all material thereof between adjacent micro-LEDs 120. For instance, thinning may reach down to the dielectric layer 410 or to a front surface 130A of the embedding layer 130. Thinning is carried out on tile/wafer level.

By virtue of the thinning process the lateral waveguide functionality of the (common) second semiconductor layer 124 is removed. This allows to implement a common front side electrode layer 150 which significantly reduces or completely avoids any optical crosstalk between adjacent micro-LEDs 120.

Figures 5C, 6A, 6B:
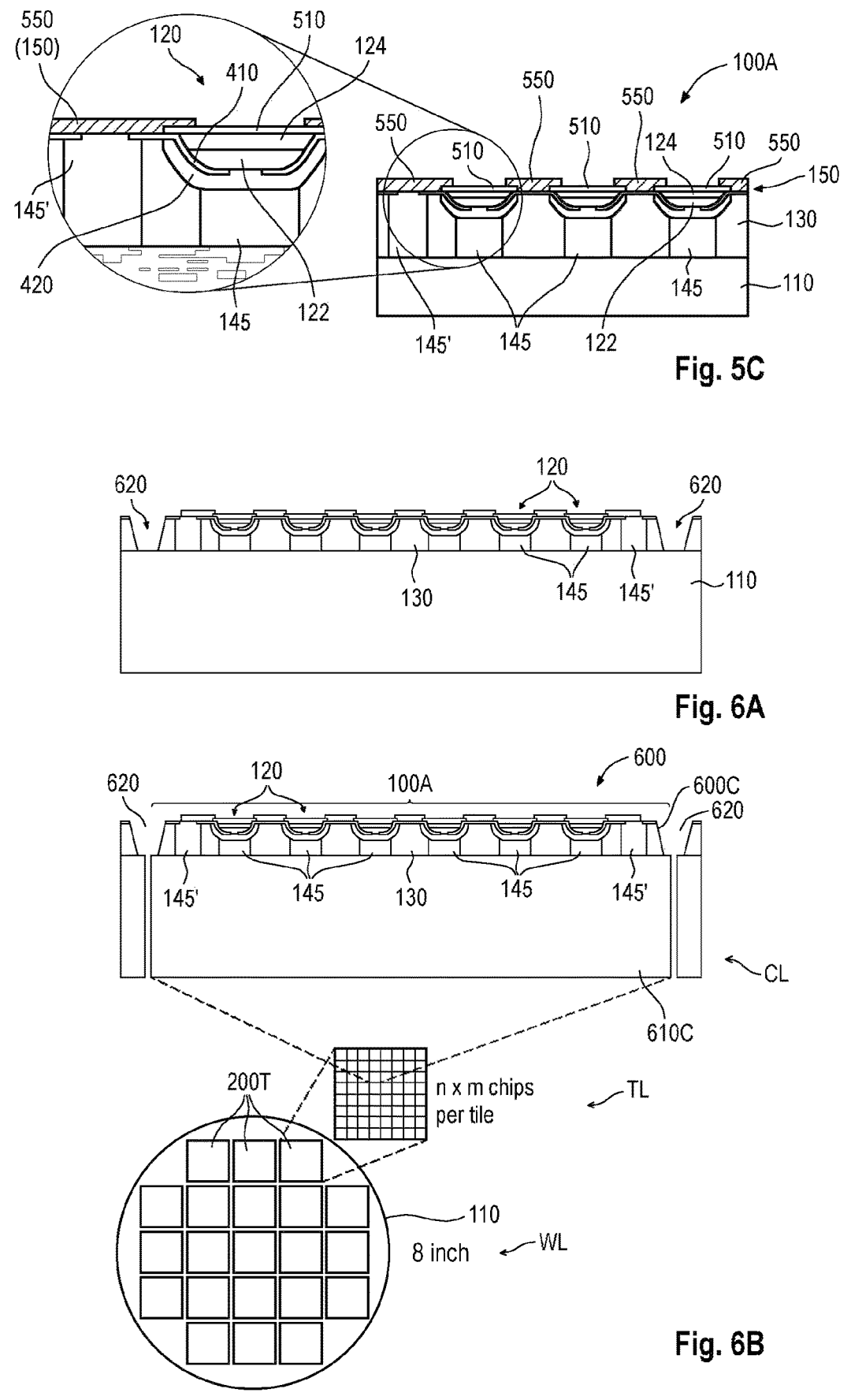

FIG. 5C illustrates an example of forming a common front side electrode layer 150 on tile/wafer level. In this specific example, the common electrode layer 150 comprises metal and TCO, though it is also possible to use a common front side electrode layer 150 which is merely a structured metal layer.

In this example, a continuous TCO layer is first deposited over the surface produced by the thinning process. The continuous TCO layer may then (optionally) be structured so that each micro-LED 120 has an individual TCO layer 510 which is separate from the TCO layers 510 of other micro-LEDs 120. Each individual TCO layer 510 may partly or completely cover the second semiconductor layer 124 of each micro-LED 120.

Then a metal part 550 of the common front side electrode layer 150 may be formed to electrically connect to the individual TCO layers 510 and to the contact pillar 145'. That way, the common front side electrode layer 150 extends over all the micro-LEDs 120 of a micro-LED array 100A to implement an electrical connection with low losses between the common front side electrode layer 150 and the second semiconductor layers 124 of the micro-LEDs 120. As shown in FIG. 5A, the electrically conducting TCO layer 510 may be insulated from the reflector metal layer 420 by the dielectric layer 410 to avoid shorting.

The common front side electrode layer 150 applied on tile/wafer level may be structured to electrically connected to all micro-LEDs of the micro-LED array 100A, wherein common front side electrode layers 150 of different micro-LED arrays may be disconnected from each other. This allows for micro-LED chip testing on tile/wafer level.

FIG. 5C further illustrate that the first semiconductor layer 122 and/or the second semiconductor layer 124 may taper in a downward direction. This produces a concave surface of the first and/or second semiconductor layer 122, 124, which may be used to form a reflector. More specifically, the dielectric layer 410 may have a refractive index smaller than the refractive index of the first and/or second semiconductor layers 122, 124 and may cover the tapering sidewalls of the first and/or second semiconductor layers 122, 124 to provide for total internal reflection. For instance, the dielectric layer 410 may be $SiO_2$ or other non-conducting transparent oxide(s).

Alternatively or in addition, a reflector formed in the micro-LED 120 may comprise a reflector metal layer 420.

The reflector metal layer 420 may comprise or be of Ag, Al or Rh or an alloy of one or more of these metals. For instance, the reflector metal layer 420 may comprise an atomic layer deposited (ALD) aluminum oxide (AlOx) layer 420. As the dielectric layer 410 may act as an adhesion promotor for the reflector metal layer 420, it may be beneficial to use both the dielectric layer 410 and the reflector metal layer 420.

FIGS. 6A and 6B illustrate stages of a process which may then be used for chip singulation. In FIG. 6A the embedding layer 130 may be removed in kerf regions 620 by, e.g., an etching process. Subsequently, the composite tile-to-wafer structure composed of the semiconductor wafer 110 and the plurality of wafer tiles 200T (e.g. having common front side electrode layers per micro-LED array 100A) may be separated into individual micro-LED chips.

Referring to FIG. 6B, chip singulation may be carried out by dicing (e.g. mechanical sawing or laser sawing) the semiconductor wafer 110 along the kerf regions 620. CL denotes chip level, TL denotes tile level and WL denotes (semiconductor) wafer level. Each micro-LED array 100A corresponds to one micro-LED chip 600C, and the micro-LED chips 600C are singulated together with chips 610C of the semiconductor wafer 110 by dicing the bonded-together wafer tiles 200T and semiconductor wafer 110. That way, micro-LED displays 600 are produced. In view of general hybrid devices 400 as illustrated in FIG. 4A, the micro-LED chip 600C corresponds to the singulated functional chip 100C and the semiconductor chip 610C corresponds to the semiconductor chip 110C.

It is to be noted that the schematic cross-sectional partial view of FIG. 5C illustrating the bonded-together wafer and tiles across one micro-LED array 100A after formation of the common front side electrode 150 can also be interpreted to illustrate one micro-LED display 600 after chip singulation.

FIGS. 7A-7I illustrate exemplary stages of a manufacturing method of an example of a micro-LED wafer 200 as shown e.g. in FIG. 2. Many other manufacturing methods and designs of micro-LED wafers 200 are feasible, and the following description does not limit the disclosure to any of the following specific method steps or micro-LED design features.

Figure 7A:
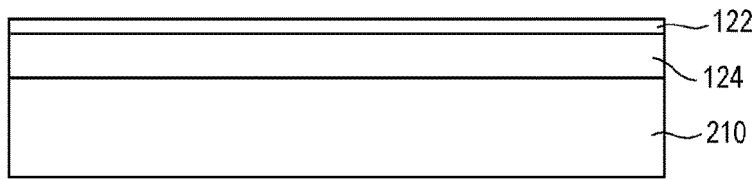
FIGS. 7A-7I are schematic cross-sectional partial views illustrating exemplary stages of manufacturing a micro LED wafer including a plurality of micro-LED arrays formed over a substrate.

Referring to FIG. 7A the second semiconductor layer 124 of a second dopant type (e.g. an epitaxial n-GaN layer) is formed over the substrate 210. The first semiconductor layer 122 (e.g. an epitaxial p-GaN layer) is formed over the second semiconductor layer 124. The substrate 210 may be of sapphire, Si, GaN, GaAs or glass or any other suitable material.

Figure 7B:
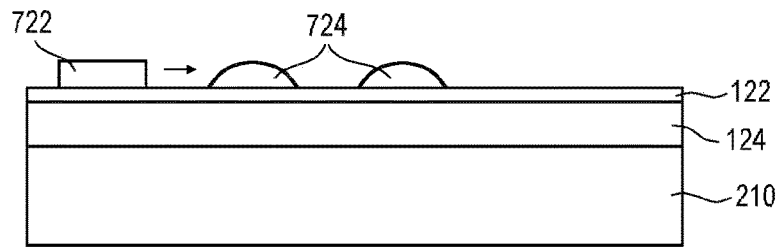
Figure 7C:
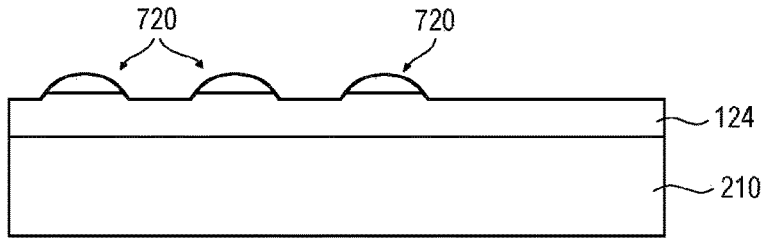

Referring to FIGS. 7B and 7C an array of mesa structures 720 is formed out of the first semiconductor layer 122 and the second semiconductor layer 124.

The mesa structures 720 may be generated by depositing and structuring a resist layer over the first semiconductor layer 122 to form an array of resist structures 722. Then, optionally, gray-scale lithography may be applied to form mesa structures 720 having a tapering shape. To that end, a resist structure reflow may be used to form rounded resist structures 724. The resist structures 722 or the rounded resist structures 724 (e.g. if gray-scale lithography is applied) may then be used to shape the mesa structures 720 by applying an etching process, e.g. dry etching.

Figure 7D:
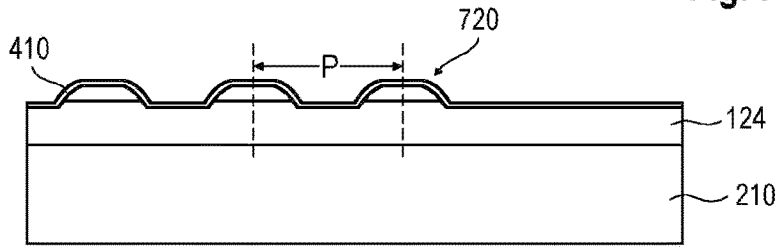

Referring to FIG. 7D, the dielectric layer 410 may then be generated over the structured first and second semiconductor layers 122, 124. For instance, a conformal oxide deposition may be used. The dielectric layer 410 may form a Bragg reflector. To this end a stack of e.g. SiOx/TaOx/SiOx/ . . . layers or a stack of e.g. SiOx/NbOx/SiOx/NbOx/ . . . layers may be formed to be comprised in the dielectric layer 410. It is also possible that the dielectric layer 410 may be configured to provide for total internal reflection, i.e. to act as a dielectric mirror.

A pitch P of the array of mesa structures 720 may depend on the aperture of the micro-LED 120 to be fabricated. In general, the micro-LED display 600 to be manufactured may have an aperture of individual micro-LEDs 120 in a range between e.g. 100 nm and 5 μm. The pitch P may thus vary in a similar broad range and may, e.g., be about 2 μm in this example.

Figure 7E:
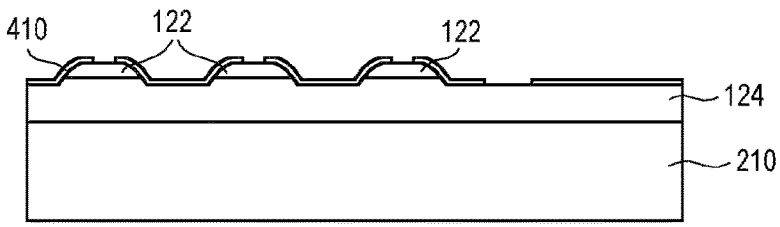

Referring to FIG. 7E, the dielectric layer 410 may then be opened in regions above the first semiconductor layers 122. The openings may be produced in central regions of the first semiconductor layers 122 where the through-connection 140 will be located.

Figure 7F:
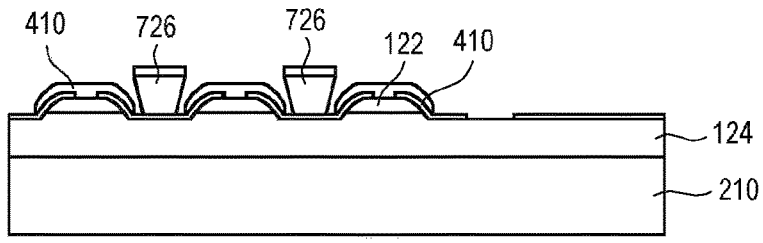
Figure 7G:
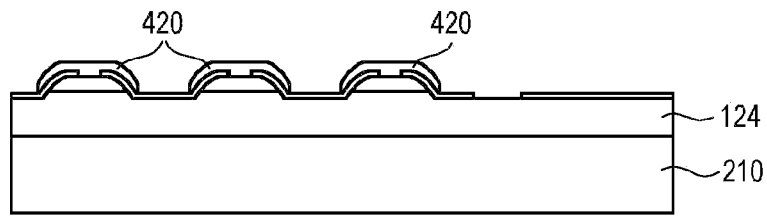

FIGS. 7F and 7G illustrate possible stages of a process of depositing and structuring a metal layer over the array of mesa structures 720 to form a reflector (i.e. the reflector metal layer 420) over each mesa structure 720. The process may utilize lift-off lithography. Lift-off lithography may involve applying a structured lift-off resist mask 726 between adjacent mesa structures 720, depositing the reflector metal layer 420 over this structure and lifting the resist mask 726 to separate the resistor metal layer 420 into the individual reflector metal layers 420. As mentioned before, an adhesion promoter layer such as, e.g., an ITO layer may be applied prior to the metal deposition step and/or the reflector metal layer 420 may e.g. be formed by an AlOx-ALD process.

Figure 7H:
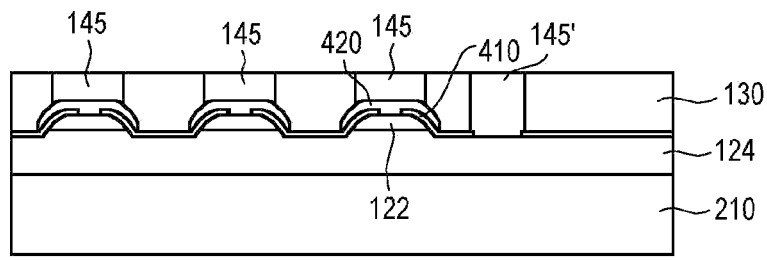

The array of mesa structures 720 is then embedded in the embedding layer 130. Referring to FIG. 7H, embedding the array of mesa structures 720 may comprise depositing an embedding layer material over the array of mesa structures 720. The embedding layer material may comprise or be of silicon oxide, silicon nitride and/or a dielectric material.

By way of example, still referring to FIG. 7H, an oxide material may be deposited as embedding layer 130. Openings may then be formed in the embedding layer 130 by using lithography. The openings are then filled by a conductive material such as, e.g., a metal (e.g. Cu) to provide for the contact pillars 145 and 145'. Metal filling may be carried out by a plating process, e.g. galvanic plating or electroless plating. For instance, a TiWCu seed layer (not shown) may be formed in each opening and copper filling may be done by electro-chemical deposition (ECD). A stress compensation layer (not shown) may be arranged between the reflector metal layer 420 (e.g. Au-layer) and the contact pillars 145.

Generally, the through-connections 140 may be formed of any electrically conductive material(s). For instance, the contact pillars 145, 145' may be formed of Cu or an alloy based on Cu.

Figure 7I:
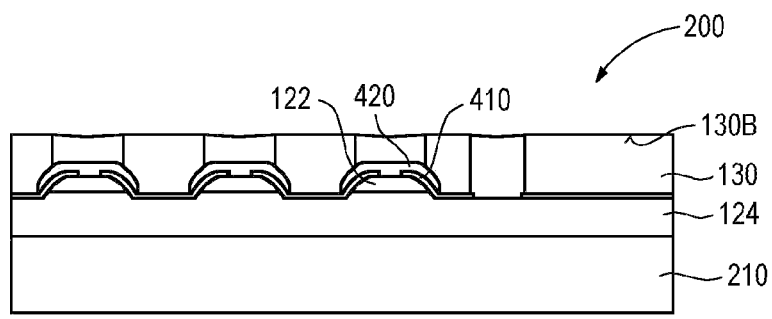

Referring to FIG. 7I, a planarizing process using, e.g., chemical mechanical polishing (CMP) may then be carried out to prepare the back surface 130B of the embedding layer 130. A high evenness of the back surface 130B is important for later hybrid bonding. As a result, a micro-LED wafer 200 as, e.g., illustrated in FIG. 2 is obtained.

Figure 8:
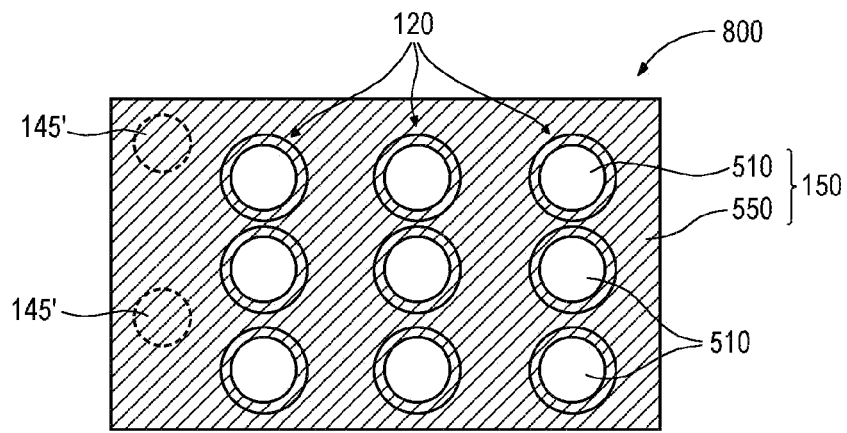
FIG. 8 is a schematic front side partial view of an exemplary micro-LED display according to a design of the common front side electrode layer as shown in FIG. 5C.

FIG. 8 is a schematic front side partial view of an exemplary micro-LED display 800 according to a design of the common front side electrode layer as shown in FIG. 5C. In this example, the front side electrode layer 150 is a continuous common front side electrode layer 150 composed of the plurality of TCO layers 510 and the metal part 550 of the common front side electrode layer 150. As apparent from these figures, the metal part 550 of the common front side electrode layer 150 may be shaped to overlap with the reflector metal layer 420 in a vertical projection to define the aperture of a micro-LED 120 (i.e. a pixel). In other examples, the front side electrode layer 150 may be structured in a hole pattern, wherein each hole opens to an emission surface (here: e.g. the second semiconductor layer 124) of an individual micro-LED 120. In this case, the front side electrode layer 150 may be made only of metal (corresponding to the metal part 550) and no TCO layers 510 are used.

Figure 9:
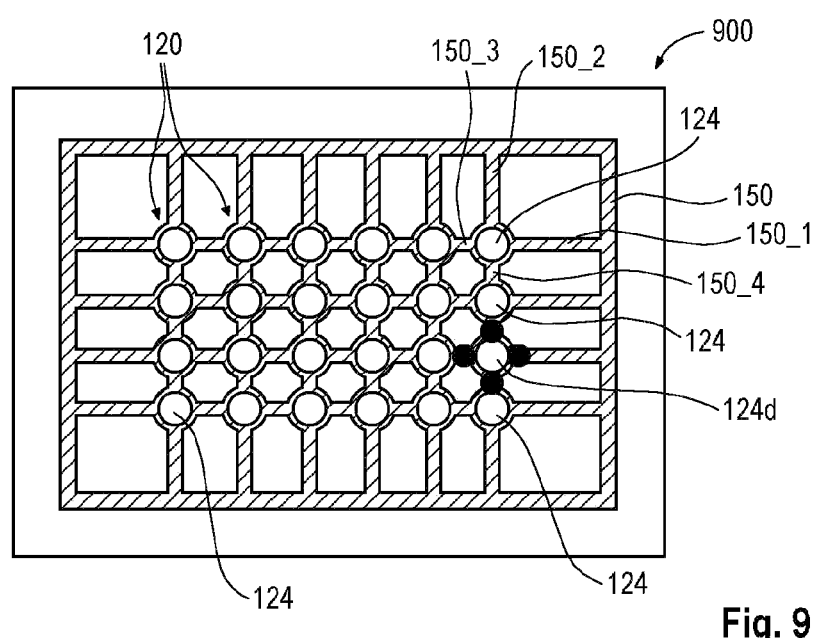
FIG. 9 is a schematic front side partial view of an exemplary micro-LED display according to another design option of the common front side electrode layer.

FIG. 9 is a schematic front side partial view of an exemplary micro-LED display 900 according to another design option for the common front side electrode layer 150. In this example, the common front side electrode layer 150 is structured in a mesh pattern. Each micro-LED 120 may be connected to the common front side electrode layer 150 by one or a plurality of conductor traces 150_1, 150_2, 150_3, 150_4. This allows to individually deactivate a specific micro-LED (i.e. pixel) of the micro-LED display 900. For instance, reference sign 124d denotes the second semiconductor layer of a defective micro-LED. In this case, the conductor traces 150_1, 150_2, 150_3, 150_4 connecting to this defective micro-LED may be opened e.g. by laser ablation to deactivate this pixel. Opening of the conductor traces 150_1, 150_2, 150_3, 150_4 for pixel deactivation is illustrated by four solid circles (corresponding e.g. to laser beam spots) grouped around the defective micro-LED.

The process of deactivating of defective micro-LEDs 120 may, e.g., be carried out on tile-to-wafer level, i.e. before chip singulation.

The following examples pertain to further aspects of the disclosure:

Example 1 is a method of manufacturing a hybrid device, the method comprising processing a wafer to form a plurality of functional chips integral with the wafer; defining a plurality of wafer tiles in the wafer, wherein each wafer tile is composed of a cluster of functional chips; singulating the wafer tiles by wafer dicing; bonding a plurality of separate wafer tiles to a semiconductor wafer by hybrid bonding; and singulating the functional chips together with chips of the semiconductor wafer by dicing the bonded-together wafer tiles and semiconductor wafer.

In Example 2, the subject matter of Example 1 can optionally include wherein each wafer tile has a polygonal shape.

In Example 3, the subject matter of Example 1 or 2 can optionally include wherein a first lateral dimension of the wafer tile is in a range between 20 and 60 mm and a second lateral dimension of the wafer tile is in a range between 20 and 60 mm.

In Example 4, the subject matter of any preceding Example can optionally include wherein the number of separate wafer tiles bonded to the semiconductor wafer is between 10 and 50.

In Example 5, the subject matter of any preceding Example can optionally include wherein the semiconductor wafer includes integrated circuits for controlling each functional chip of the plurality of functional chips.

In Example 6, the subject matter of any preceding Example can optionally include wherein the wafer and the semiconductor wafer exhibit significantly different thermo-mechanical properties.

In Example 7, the subject matter of any preceding Example can optionally include wherein the wafer comprises a III-V semiconductor layer.

In Example 8, the subject matter of any preceding Example can optionally include wherein the semiconductor wafer is a Si wafer.

In Example 9, the subject matter of any preceding Example can optionally include wherein the wafer is a micro-LED wafer and each functional chip of the plurality of functional chips contains a micro-LED array In Example 10, the subject matter of Example 9 can optionally include wherein each wafer tile comprises a substrate, a first semiconductor layer of a first dopant type arranged over the substrate and a second semiconductor layer of a second dopant type arranged over the first semiconductor layer, the method further comprising: removing the substrates of each wafer tile after bonding the plurality of separate wafer tiles to the semiconductor wafer.

In Example 11, the subject matter of Example 10 can optionally include thinning the wafer tiles at a surface available after removing the substrates of each wafer tile.

In Example 12, the subject matter of Example 10 or 11 can optionally include forming a common front side electrode layer on a surface of each wafer tile available after removing the substrates of each wafer tile or after thinning the wafer tiles.

In Example 13, the subject matter of any of the Examples 7 to 12 can optionally include wherein each micro-LED array of a wafer tile has a common front side electrode layer electrically connected to all micro-LEDs of the micro-LED array, wherein common front side electrode layers of different micro-LED arrays are disconnected from each other.

In Example 14, the subject matter of Example 13 can optionally include wherein the common front side electrode layer of each micro-LED array is formed by metal deposition and/or transparent conducting oxide generation.

In all Examples the hybrid device may, e.g., be a micro-light-emitting diode display, the wafer may be a micro-LED wafer, each functional chip integral with the wafer may be a micro-LED array and/or the semiconductor wafer may include integrated circuits for controlling functional devices of the functional chip such as, e.g. micro-LEDs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a hybrid device, the method comprising:
    processing a wafer to form a plurality of functional chips integral with the wafer;
    defining a plurality of wafer tiles in the wafer, wherein each wafer tile is composed of a cluster of functional chips;
    singulating the wafer tiles by wafer dicing;
    bonding a plurality of separate wafer tiles to a semiconductor wafer by hybrid bonding; and
    singulating the functional chips together with chips of the semiconductor wafer by dicing the bonded-together wafer tiles and the semiconductor wafer.

2. The method of claim 1, wherein each wafer tile has a polygonal shape.

3. The method of claim 1, wherein a first lateral dimension of each wafer tile is in a range between 20 and 60 mm and a second lateral dimension of each wafer tile is in a range between 20 and 60 mm.

4. The method of claim 1, wherein the number of separate wafer tiles bonded to the semiconductor wafer is between 10 and 50.

5. The method of claim 1, wherein the semiconductor wafer includes integrated circuits for controlling each functional chip of the plurality of functional chips.

6. The method of claim 1, wherein the wafer and the semiconductor wafer exhibit different thermomechanical properties.

7. The method of claim 1, wherein the wafer comprises a III-V semiconductor layer.

8. The method of claim 1, wherein the semiconductor wafer is a Si wafer.

9. The method of claim 1, wherein the wafer is a micro-LED wafer and each functional chip of the plurality of functional chips contains a micro-LED array.

10. The method of claim 9, wherein each wafer tile comprises a substrate, a first semiconductor layer of a first dopant type arranged over the substrate, and a second semiconductor layer of a second dopant type arranged over the first semiconductor layer, the method further comprising:
removing the substrates of each wafer tile after bonding the plurality of separate wafer tiles to the semiconductor wafer.

11. The method of claim 10, further comprising:
thinning the wafer tiles at a surface available after removing the substrates of each wafer tile.

12. The method of claim 10, further comprising:
forming a common front side electrode layer on a surface of each wafer tile available after removing the substrates of each wafer tile or after thinning.

13. The method of claim 9, wherein each micro-LED array of a wafer tile has a common front side electrode layer electrically connected to all micro-LEDs of the micro-LED array, and wherein common front side electrode layers of different micro-LED arrays are disconnected from each other.

14. The method of claim 13, wherein the common front side electrode layer of each micro-LED array is formed by metal deposition and/or transparent conducting oxide generation.

* * * * *

UNITED STATES PATENT AND TRADEMARK OFFICE
CERTIFICATE OF CORRECTION

PATENT NO. : 12,300,759 B2
APPLICATION NO. : 17/573044
DATED : May 13, 2025
INVENTOR(S) : F. Singer et al.

It is certified that error appears in the above-identified patent and that said Letters Patent is hereby corrected as shown below:

On the Title Page

Item (56)/U.S. Patent Documents, Line 7, please change "Peräläet al." to -- Perälä, et al. --

Signed and Sealed this
Eighth Day of July, 2025

Coke Morgan Stewart
*Acting Director of the United States Patent and Trademark Office*